(12) United States Patent
Thurk et al.

(10) Patent No.: US 6,849,943 B2
(45) Date of Patent: Feb. 1, 2005

(54) POWER MODULE PACKAGE FOR HIGH FREQUENCY SWITCHING SYSTEM

(75) Inventors: John P. Thurk, Madison, WI (US); Eric W. Suomi, Madison, WI (US); Bradley J. Brunker, Madison, WI (US)

(73) Assignee: Electronic Theatre Controls, Inc., Middleton, WI (US)

( * ) Notice: Subject to any disclaimer, the term of this patent is extended or adjusted under 35 U.S.C. 154(b) by 6 days.

(21) Appl. No.: 10/457,067

(22) Filed: Jun. 6, 2003

(65) Prior Publication Data

US 2004/0246662 A1 Dec. 9, 2004

(51) Int. Cl.[7] .............................................. H01L 23/34
(52) U.S. Cl. ....................... 257/712; 257/713; 257/717; 257/675
(58) Field of Search ................................ 257/712, 713, 257/717, 675, 341

(56) References Cited

U.S. PATENT DOCUMENTS

| | | |
|---|---|---|
| 5,045,774 A | 9/1991 | Bromberg |
| 5,424,618 A | 6/1995 | Bertenshaw et al. |
| 5,500,575 A | 3/1996 | Ionescu |
| 5,714,847 A | 2/1998 | Lindauer et al. |
| 5,770,928 A | 6/1998 | Chansky et al. |
| 6,690,087 B2 * | 2/2004 | Kobayashi et al. .......... 257/686 |
| 6,707,256 B2 * | 3/2004 | Brunker et al. ............. 315/112 |

* cited by examiner

*Primary Examiner*—Mark V. Prenty
(74) *Attorney, Agent, or Firm*—Greer, Burns & Crain, Ltd.; Philip M. Kolehmainen

(57) ABSTRACT

A heat sink with fins has a flat, planar surface soldered to a metallic layer at one surface of a flat, planar ceramic layer. The opposite surface of the ceramic layer has a metallic pattern including base areas for high power, high frequency load switching MOSFETs. Lead frames are soldered between the lead frame base areas and base contact areas of the MOSFET packages. Thermal conduction between the MOSFETs and the heat sink dissipates the heat from switching losses. A gate drive circuit board for the load switching system is supported spaced from the and is separated from the MOSFETs by a thermally blocking air gap, with the component side of the gate drive circuit board facing away from the MOSFETs. Spade terminals of the lead frames extend through openings in the gate drive circuit board to route high power signals independently of the gate driver circuit board.

16 Claims, 4 Drawing Sheets

POWER MODULE PACKAGE FOR HIGH FREQUENCY SWITCHING SYSTEM

FIELD OF THE INVENTION

The present invention relates to a power module package for high frequency solid state switching for electric light dimmers and the like.

DESCRIPTION OF THE PRIOR ART

Luminaires for theatrical, architectural and other applications are typically provided with power by dimmers so that the lamps of the luminaires can be dimmed, or operated at variable, selected light levels. Phase angle dimmers for this purpose are well known, and typically include solid state switches such as SCRs for interconnecting an AC power source to a lamp load. AC voltage from the source is sinusoidal. A phase control circuit renders a solid state switch conductive at a point during a half cycle of the sinusoid, the point being selected to supply to the lamp a lamp operating pulse having a desired quantity of power in order to produce a desired level of light. Switching operations are performed by the SCRs in a phase angle dimmer at a low frequency, for example twice in each power supply cycle of fifty or sixty cycles per second.

With a phase angle dimmer, the abrupt low frequency switching during the half cycles of the power supply and resultant abrupt amplitude changes in the current supplied to a luminaire can cause problems of electrical noise and mechanical filament noise, and requires extensive filtering. In some dimmer applications, even with filtering, the noise incident to phase angle dimming can be unacceptable.

To avoid the potential problems with low frequency, phase angle dimming it has been proposed to use pulse width modulation (PWM) techniques with solid state switches operating at a higher frequency. With this type of dimmer power supply, known as a switch mode or PWM power supply, light intensity is varied by changing the pulse width modulation duty cycle. The output, after filtering, can have a shape similar to the power supply wave form. For this reason, pulse width modulation dimmers are also described as sine wave dimmers. U.S. Pat. No. 5,054,774 describes a power supply of this type. U.S. Pat. Nos. 5,424,618, 5,500, 5765 and 5,714,847 describe similar systems.

Switching losses result in heat when solid state switches are operated. In a high frequency, high power switching system such as a PWM dimmer, a number of solid state devices are switched at high frequencies, typically in the range of twenty to fifty kilohertz, and can switch currents as high as twenty or even fifty amps at one hundred twenty or two hundred thirty volts. This results in the need to dissipate a large amount of heat. It is desirable to provide the dimming function with small, compact equipment. Small package size and high component density make heat dissipation more difficult. Heat sinks are typically used in packages containing solid state switches. However, even with optimized heat dissipation, the package containing the solid state switches operates at an elevated temperature unsuitable for lower power components such as the gate driver circuit controlling the power switching operation. This makes it difficult to locate the gate drive circuit near the power switching components.

SUMMARY OF THE INVENTION

A primary object of the present invention is to provide an improved power module package for high frequency and high power switching applications. Other objects are to provide a power module package that effectively dissipates switching heat losses; to provide a power module package that is compact in size, rugged and easy to manufacture; to provide a power module package that includes a gate driver circuit board adjacent to but thermally isolated from the power switching section of the power module package; to provide a power module package having design flexibility because the gate driver circuit can be modified or replaced with no change to the power switching section; and to provide a power module package overcoming problems to which known designs are subject.

In brief, in accordance with the invention there is provided a power module package for a solid state switching system. The power module package includes a heat sink having a flat, planar surface and a ceramic card assembly having a flat planar electrically insulating and thermally conductive ceramic layer with opposed first and second faces. A metallic layer is bonded onto the first face of the ceramic layer, and the metallic layer is bonded to the flat, planar heat sink surface. A metallic pattern is bonded onto the second face of the ceramic layer. A plurality of high power solid state switch units each has a flat, planar base contact. The metallic pattern includes a base area for each of the switch units. A plurality of lead frames, one for each of the switch units, each includes a pad portion having opposed first and second surfaces and including a terminal portion. The first surfaces of the pad portions are bonded to the base areas of the metallic pattern and the second surfaces of the pad portions are bonded to the base portions of the switch units.

BRIEF DESCRIPTION OF THE DRAWING

The present invention together with the above and other objects and advantages may best be understood from the following detailed description of the preferred embodiment of the invention illustrated in the drawings, wherein.

DETAILED DESCRIPTION OF THE PREFERRED EMBODIMENT

Figure 1:
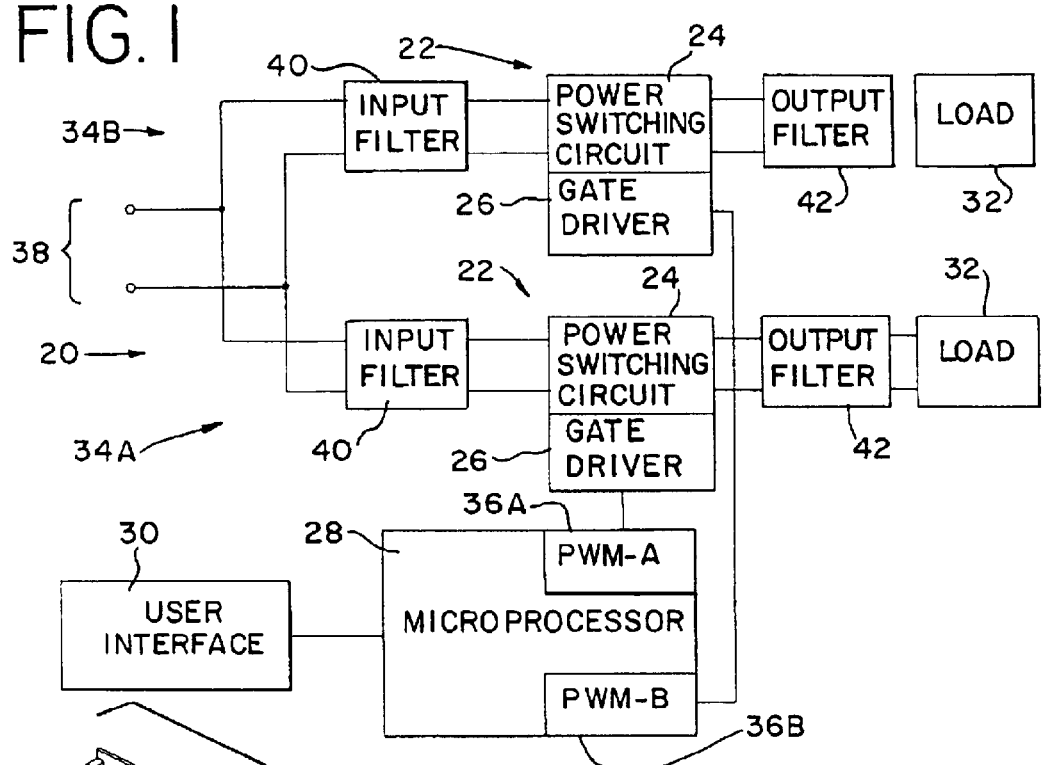
FIG. 1 is a simplified block diagram of a representative two channel pulse width modulation dimmer system having two power module packages constructed in accordance with the present invention.

Having reference now to the drawing, FIG. 1 is a simplified block diagram of a representative pulse width modulation (PWM) dimmer system generally designated as 20 and including a pair of power module packages 22 each constructed in accordance with the principles of the present invention. Each power module package 22 includes a power switching section 24 and a gate driver circuit 26. The block diagram of FIG. 1 excludes those capabilities and features of an actual dimmer system that are unnecessary to an understanding of the present invention, and is intended to be generally representative of PWM, switch mode and sine wave dimmers and other similar high frequency, high power solid state switching systems.

In operation of the dimmer system 20, a microprocessor 28 with inputs including a user interface 30 controls the intensity of incandescent lamps or other loads 32 through two independently operated dimming channels 34A and 34B. The principles of the invention can be applied to dimmer systems having one or more than two channels. In the illustrated system 20, the microprocessor 28 provides PWM signals from two PWM sections 36A and 36B. In each dimming channel 34A and 34B, the PWM duty cycle is established by microprocessor operation at a value corresponding to the desired light intensity level for the corresponding load 32. The PWM signals are applied to the gate driver circuits 26 for the control of the power switching sections 24.

Power supply terminals 38 are connected to a power source such as a fifty or sixty hertz, one hundred twenty or two hundred thirty volt supply. Input filters 40 are connected between the power supply terminals 38 and the inputs of the power switching sections 24, and output filters 42 are connected between the outputs of the power switching sections 24 and the loads 32.

In each dimming channel 34A and 34B, the gate drive circuit 26 operates solid state switch devices in the power switching section 24 to open and close the current flow path between the power supply terminals 38 and the load 32. The switching is performed in accordance with the duty cycle of the PWM signal. The PWM signal is typically at a high frequency of from about twenty to about fifty kilohertz, and more commonly in the range of from about twenty-five to about thirty-five kilohertz. The current being rapidly switched on and off in the power switching section 24 may be as much as fifty amps in some applications, and typically may be as much as about twenty amps. This high frequency switching of high power results in a large amount of switching loss heat that must be dissipated in order for the dimmer system 20 to operate reliably.

Figure 2:
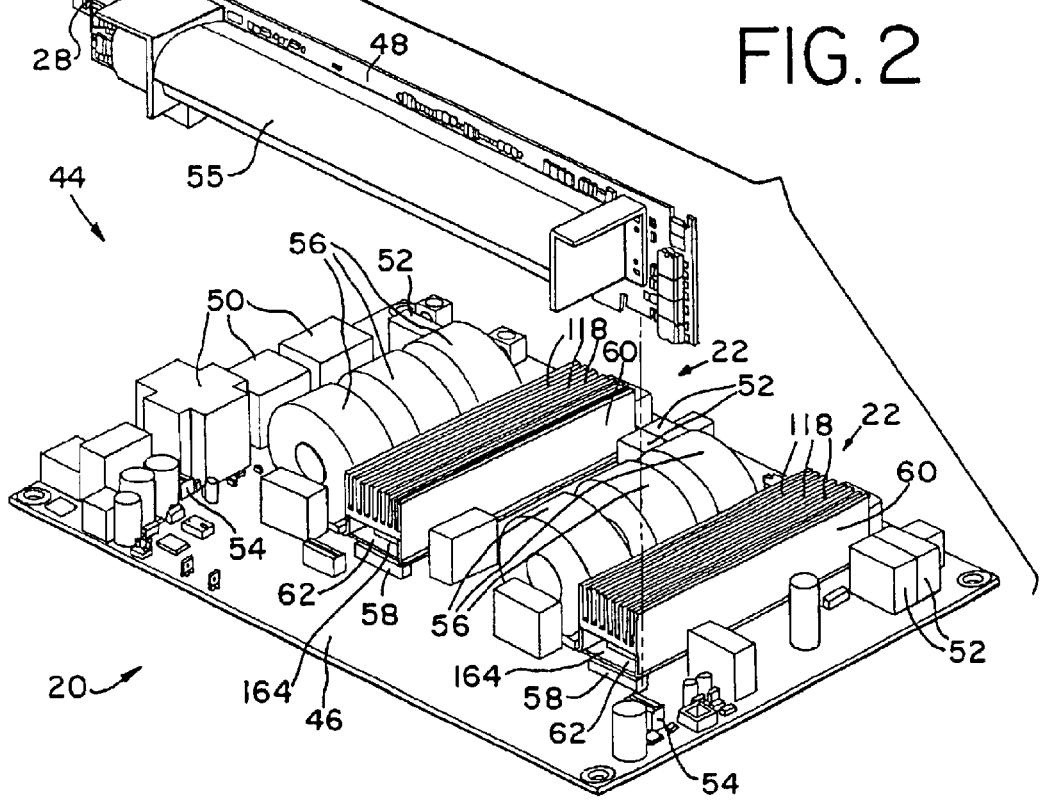
FIG. 2 an exploded front and top isometric view of the circuit boards and components of the system of FIG. 1.

FIG. 2 illustrates a circuit assembly 44 for the dimmer system 20. This circuit arrangement is similar in many respects to the dimmer pack disclosed in copending U.S. patent application Ser. No. 10/180,200 filed on Jun. 25, 2002, now U.S. Pat. No. 6,707,256. That document is incorporated herein by reference to provide a description of the circuit arrangement beyond that needed for an understanding of the present invention.

The circuit assembly 44 includes a main power circuit board 46 and a control circuit board 48. The main board 46 includes circuit paths (not shown) that connect high power circuit components including power supply transformers 50 and filter capacitors 52. Edge connectors 54 on the main board 46 support the control board 48 and extend electrical connections to circuit paths (not shown) on the control board. The control board 48 supports a low voltage control circuit including various low voltage circuit components of the dimmer system 20 including the microprocessor 28. The control board 48 also supports a cooling fan 55.

The main board 46 supports the power module packages 22 of the present invention. Toroidal chokes 56 associated with the input and output filters 40 and 42 are also mounted on the main board 46. The power module packages 22 are received onto the main board 46 with a simple plug in connection. This has the advantages of facilitating initial assembly as well as field replacement of the power module packages 22. In order to support the power module packages 22 and to extend high and low voltage connections to the power module packages, the main board 46 includes a pin terminal receptacle connector 58 and three high current spade terminal receptacle connectors (not shown) for each power module package 22.

One of the power module packages 22 of the present invention is illustrated in detail in FIGS. 3–8. In general the power module package 22 includes a heat sink 60, the power switching section 24 and the gate driver circuit 26 carried by a gate driver circuit board 62. The power switching section 24 includes solid state high power switch devices. Typically, solid state switching is performed, for example, by metal oxide semiconductor field effect transistors (MOSFETs) or by insulated gate bipolar transistors (IGBTs), MOSFETs being preferred for circuit simplicity and performance.

Figure 7:
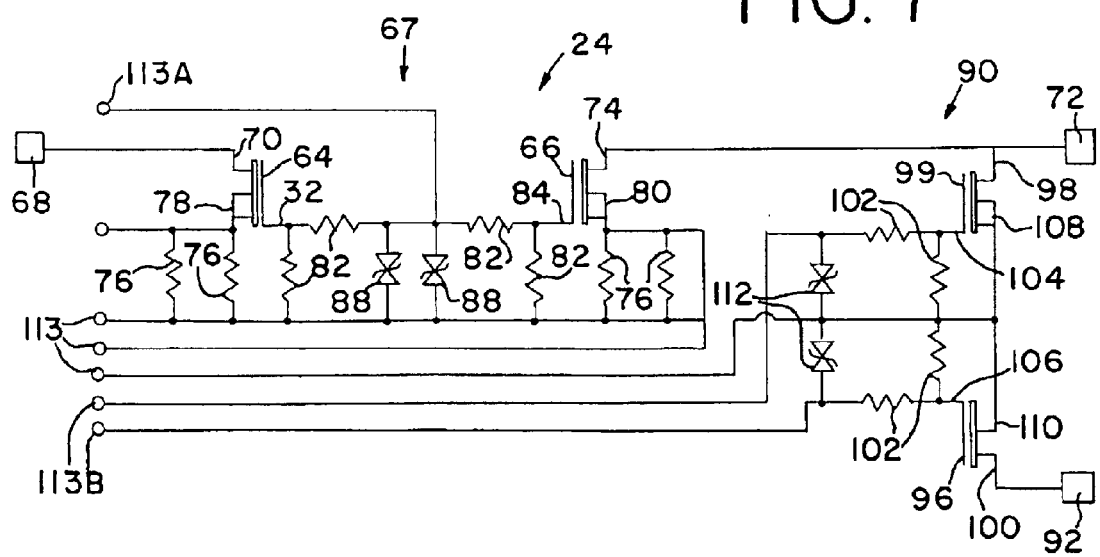
FIG. 7 is a schematic diagram of the power switching section.

An illustrative power switching section 24 is shown schematically in FIG. 7. A complementary pair of MOSFETs 64 and 66 are simultaneously rendered conductive and nonconductive to form a series switch circuit 67 between a main power input terminal 68 connected to the drain 70 of MOSFET 64 and a main power output terminal 72 connected to the drain 74 of MOSFET 66 and to the load 32. Current sensing resistors 76 are connected between ground and the sources 78 and 80 of MOSFETs 64 and 66 to provide signals for an overcurrent disabling circuit (not shown). Resistors 82 serve as bleeder resistors and stabilizing series resistors connected to the gates 82 and 84 of MOSFETs 64 and 66. Bidirectional Zeners 88 provide transient protection.

A clamp circuit 90 is connected between the main power output terminal 72 and a main neutral output terminal 92. A pair of MOSFETs 94 and 96 in series are simultaneously rendered conductive when MOSFETs 64 and 66 are non-conductive to provide a path for induced current flow from the output filters 42. Drain 98 of MOSFET 94 is connected to the main power output terminal 72 and drain 100 of MOSFET 96 is connected to the neutral terminal 92. Resistors 102 serve as bleeder resistors and stabilizing series resistors connected between ground and the gates 104 and 106 of MOSFETs 94 and 96. The sources 108 and 110 of MOSFETs 94 and 96 are grounded. Bidirectional Zeners 112 provide transient protection. The power switching section 24 includes low voltage and ground contacts 113, including gate control contacts 113A and 113B.

Figure 5:
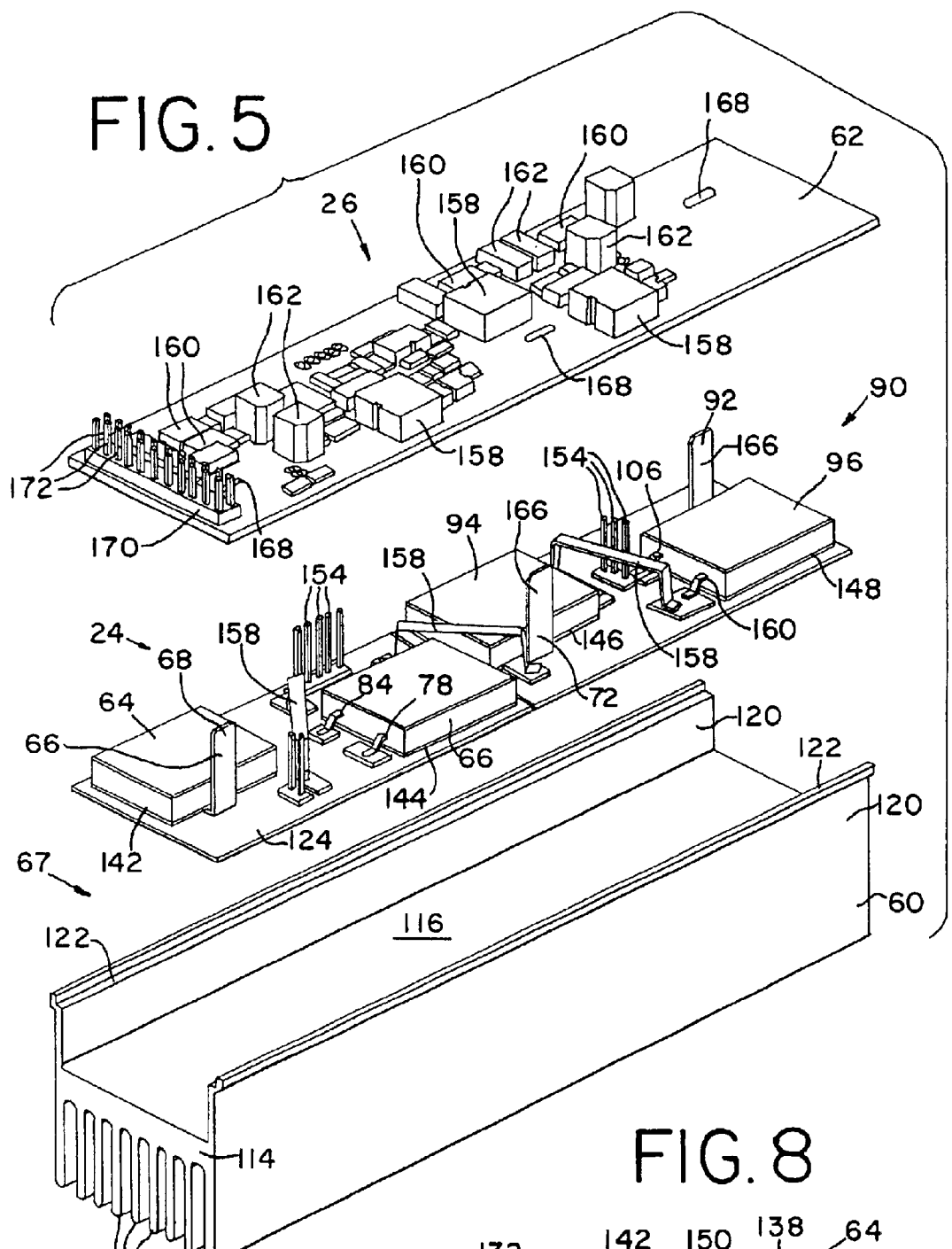
FIG. 5 is an exploded isometric view, similar to FIG. 3, showing the heat sink, the power switching section and the gate driver circuit board separated from one another.

The heat sink 60 is best seen in FIG. 5 and preferably is an elongated extruded aluminum form with a uniform cross section. A main body portion 114 provides a large area, flat, planar mounting surface 116, and integral cooling fins 118 extend from the opposite side of the main body portion 114. A pair of longitudinal side walls 120 are located at opposite sides of the mounting surface 116, and each includes a circuit board support step 122 at its edge.

Figure 8:
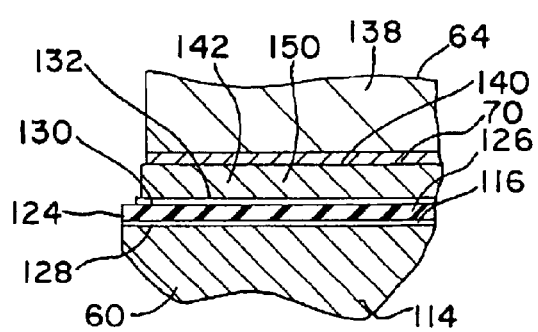
FIG. 8 is a greatly enlarged, fragmentary, cross sectional view, not to scale, of part of the heat sink and part of the power switching section of the power module package.
Figure 6:
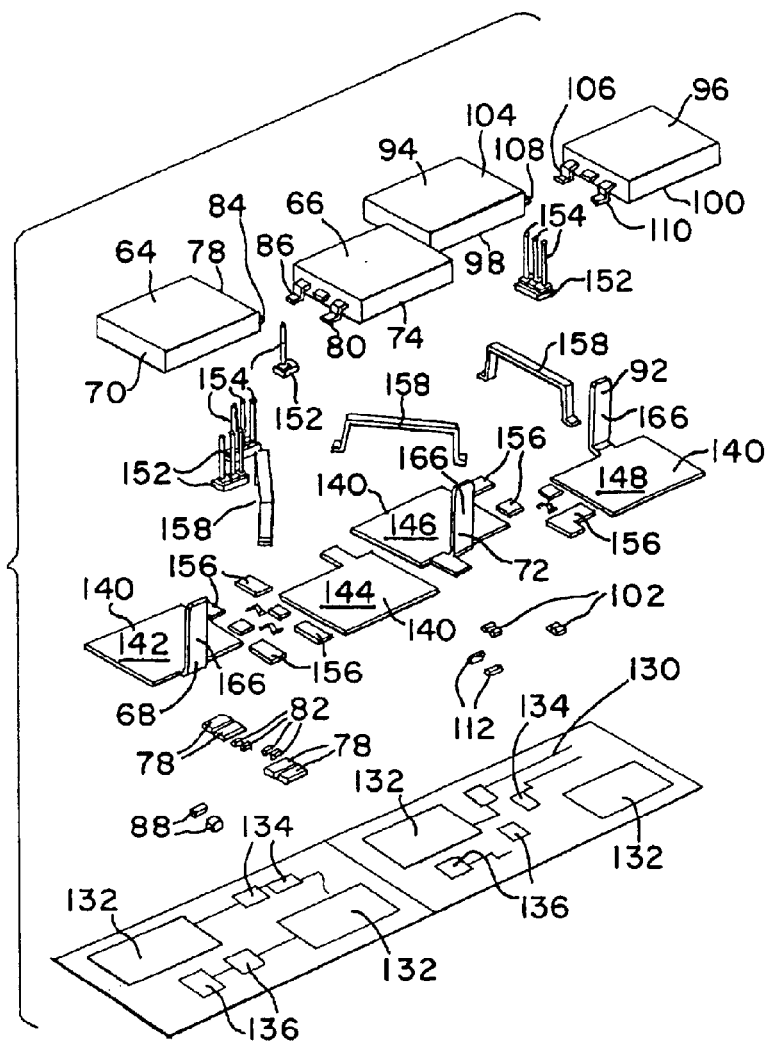
FIG. 6 is an exploded isometric view of the components of the power switching section.

The power switching section 24 includes a ceramic card assembly 124 best seen in FIGS. 5, 6 and 8. This assembly 124 includes a large area flat, planar body 126 of ceramic material that is a good electrical insulator and also is a good conductor of heat. A conductive metallic layer 128 is bonded to one face of the body 126. The conductive metallic layer 128 has a large surface area and preferably is generally coextensive with the body 124, and may be formed of copper or the like with a coating of chromium or the like to facilitate soldering. A metallic pattern 130 is bonded to the face of the body 126 opposite the metallic layer 128, so that the ceramic body 126 is sandwiched between the layer 128 and the pattern 130. The pattern 130 includes conductive traces appropriately oriented and positioned to provide the low voltage current paths of the power switching circuit 24 seen in FIG. 7. In addition, the pattern 130 includes base areas 132 corresponding to the MOSFETS 64, 66, 94 and 96. Pattern 130 also includes terminal connection regions 134 and pad connection regions 136 (FIG. 6).

The ceramic card assembly 124 can be a single part, or, as shown in the drawings, can be in two parts positioned end to end. A ceramic card assembly such as the assembly 124 can be purchased from Crydom Corporation, 2320 Paseo de las Americas, Suite 201, San Diego, Calif. 92154, United States of America. The specific manufacturing processes and materials of the ceramic card assembly 124 are unknown to the present inventors except as described herein.

The power module package 22 transfers heat effectively from the solid state switching MOSFETs 64, 66, 94 and 96 to the heat sink 60. The MOSFETs 64, 66, 94 and 96 are similar to one another and are assembled and mounted in the same way. As seen in FIG. 8 with respect to the representative MOSFET 64, the MOSFETS each include a package 138 of an insulating plastic material or the like. One of the main terminals of the MOSFET, in this case the drain terminal 70, is formed as a large area base contact 140 forming the bottom wall or surface of the MOSFET package. The drain terminal base contact 140 has a large surface area and preferably is generally coextensive with the base of the package 138.

A stamped and formed metal lead frame 142, 144, 146 and 148 is provided for each MOSFET 64, 66, 94 and 96. Each lead frame includes a base portion 150. As seen in the representative illustration of FIG. 8, the base portion 150 of the lead frame 142 is intimately bonded to the base contact 140 of the drain terminal 70 and also to the base area 132 of the metallic pattern 130 of the ceramic card assembly 124. In addition, the metallic layer 128 of the ceramic card assembly is intimately bonded to the flat, planar mounting surface 116 of the heat sink 60. Preferably the bonding between the MOSFET base contact 140 and the base portion 150, the bonding between the base portion 150 and the base area 132, and the bonding between the metal layer 128 and the mounting surface 116 are formed by soldering in order to provide good heat transfer and electrical conduction.

The terminal connection regions 134 of the metallic pattern 130 are connected, preferably by soldering, to pin terminal connectors 152 having terminal pins 154 extending outward from the ceramic card assembly 124. The terminal pins 154 provide the low voltage, ground and control contacts 113, 113A and 113B seen in FIG. 7.

A number of conductive metal contact pads 156 are connected, preferably by soldering, to the pad connection regions 136 of the metallic pattern 130 of the ceramic card assembly. Some of the pads 156 provide high current connections to metal conductor bridges 158 in order to provide the high power MOSFET terminal connections seen in FIG. 7. Source and gate terminals of the MOSFETS are connected, preferably by soldering, to some pads 156 (see terminals 78 and 824 in FIG. 5). Pads 156 also provide connection points and supports for circuit components of the power switching section 24 such as the resistors 76, 82 and 102 and the bidirectional zeners 88 and 112.

The gate driver circuit board 62 supports numerous active circuit components such as integrated circuits 158, voltage regulators 160, capacitors 162 and others. Some of these components of the gate drive circuit 26 carried by the board 62 cannot withstand elevated temperatures. However, it is desired to position the gate drive circuit 26 in the near vicinity of the power switching section 24. In the power module package 22 of the invention, the gate drive circuit 26 is located near the power switching section 24, but is protected from the adverse effect of the high operating temperature of the power switching section 24.

Figure 3:
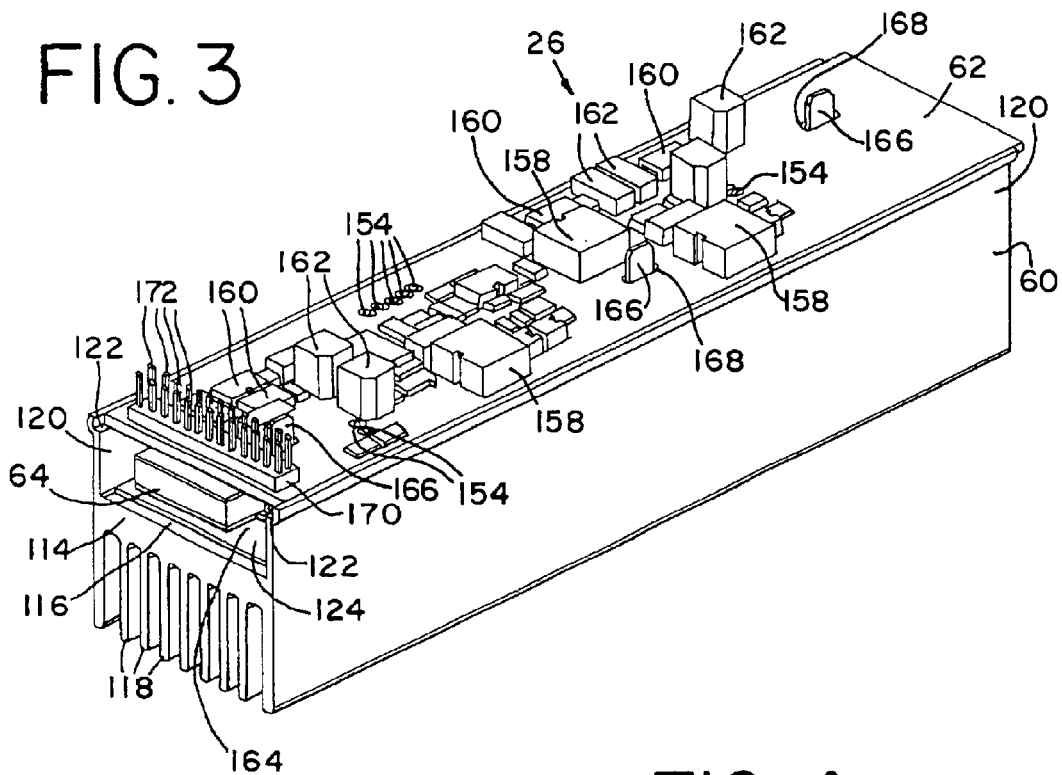
FIG. 3 is a front and bottom isometric view of one of the power module packages.
Figure 4:
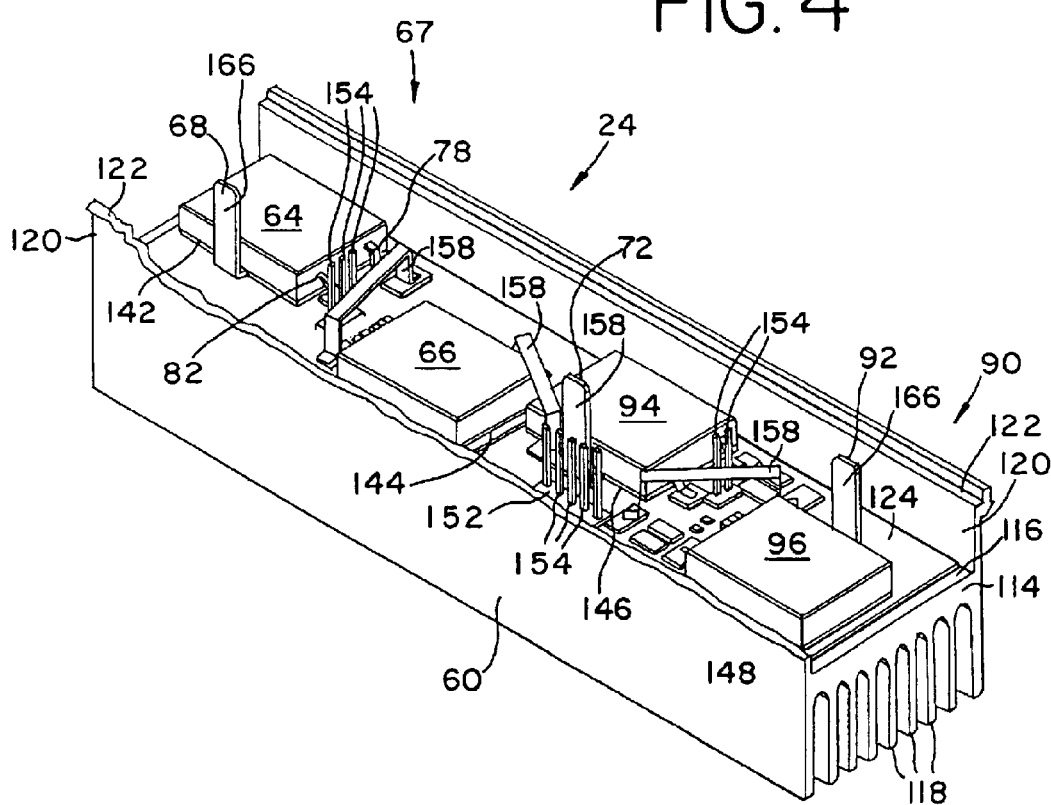
FIG. 4 is a front and bottom isometric view of the power module package of FIG. 3 with the gate drive circuit board omitted and with portions of the heat sink removed.

The gate drive circuit board is mounted by nesting the edges of the board 62 in the steps 122 formed in the longitudinal side walls of the heat sink 60 (FIG. 3). In this position, the MOSFETs of the power switching section 24 are located between the board 62 and the ceramic card assembly 124. An air gap 164 is defined between the board 62 and the power switching section 24 to provide thermal isolation. As a result the gate drive circuit 26 operates at a lower temperature than the power switching section 24. In addition, the component side of the board 62 carrying the active circuit components 158, 160, 162 and others faces away from the power switching section 24. This permits the board 62 to block heat radiated from the power switching MOSFETs, further reducing the thermal coupling between the power switching section 24 and the gate drive circuit 26.

In the mounted position of the board 62, the terminal pins 154 are received into holes in the board 62 and are soldered to conductive traces on the board (FIG. 3) to extend low voltage and ground connections between the power switching section 24 and the gate drive circuit 26. The lead frames 142, 146 and 148 include spade terminal portions 166 providing the high power input and output connections 68, 72 and 92 of the gate drive circuit seen in FIG. 7. The board 62 includes openings 168 aligned with the spade terminals 166. Rather than routing high power signals to the board 62, the high capacity spade terminals conduct the high currents through the openings 168 and directly to the main power circuit board 46. This simplifies the circuit construction and also reduces the operating temperature of the gate drive circuit 26.

The gate drive circuit board 62 includes a pin terminal connector 170 with terminal pins 172. When the power module package 22 is plugged into the main power circuit board 46 the pins 172 are received into the corresponding pin terminal receptacle connector 58 to extend low voltage power and control signal connections between the boards 46 and 62. The spade terminals 168 are simultaneously mated with high capacity spade terminal sockets (not shown) to extend high power connections between the power switching section 24 and the main power board 46, bypassing the gate drive circuit 26.

The metal heat sink 60 is not connected by fasteners or otherwise to chassis ground of the circuit assembly 44. the only electrical or mechanical connection to the heat sink 68 is the solder bonding of the metallic layer 128 of the ceramic card assembly 124 to the flat planar heart sink surface 116. The floating heat sink 60 does not provide a current path to ground for high frequency switching noise and thus has a RF noise suppression benefit.

While the present invention has been described with reference to the details of the embodiment of the invention shown in the drawing, these details are not intended to limit the scope of the invention as claimed in the appended claims.

What is claimed is:

1. A power module package for a solid state switching system, said power module package comprising:

a heat sink having a flat, planar surface;

a ceramic card assembly having a flat planar electrically insulating and thermally conductive ceramic layer with opposed first and second faces;

a metallic layer bonded onto said first face of said ceramic layer, said metallic layer being bonded to said flat, planar heat sink surface;

a metallic pattern bonded onto said second face of said ceramic layer;

a plurality of high power solid state switch units, each having a flat, planar base contact;

said metallic pattern including a base area for each of said switch units;

a plurality of lead frames, one for each of said switch units, each said lead frame including a pad portion having opposed first and second surfaces and including a terminal portion;

said first surfaces of said pad portions being bonded to said base areas of said metallic pattern and said second surfaces of said pad portions being bonded to said base portions of said switch units.

2. A power module package as claimed in claim 1, further comprising a gate driver circuit board including circuitry for providing driving signals to said switch units, said gate driver circuit board being mounted adjacent to said ceramic card assembly and defining a thermal blocking air gap between said switch units and said gate driver circuit board, said switch units being located between said gate driver circuit board and said ceramic card assembly.

3. A power module package as claimed in claim 2, said gate driver circuit board having active components on one side of said board, said gate driver circuit board being mounted with said one side facing away from said switch units.

4. A power module package as claimed in claim 2, an opening extending through said gate driver circuit board, one of said lead frame terminal portions extending through said opening and beyond said gate driver circuit board.

5. A power module package as claimed in claim 2, further comprising a circuit board support engaging said gate driver circuit board and holding said gate driver circuit board parallel to said ceramic card assembly.

6. A power module package as claimed in claim 5, said heat sink including an edge wall structure extending beyond said flat, planar surface of said heat sink, said edge wall structure including said circuit board support.

7. A power module package as claimed in claim 1, said metallic layer being soldered to said flat, planar heat sink surface, said first surfaces of said pad portions being soldered to said base areas of said metallic pattern, and said second surfaces of said pad portions being soldered to said base portions of said switch units.

8. A power module package as claimed in claim 7, said metallic pattern including a terminal connection region, a pin terminal connector soldered to said terminal connection region, said pin terminal connector including a plurality of terminal pins extending away from said ceramic card assembly beyond said switch units, and a gate driver circuit board soldered to said pins.

9. A power module package as claimed in claim 8, an opening extending through said gate driver circuit board, one of said lead frame terminal portions extending through said opening and beyond said gate driver circuit board.

10. A power module package as claimed in claim 8, further comprising a circuit board support engaging said gate driver circuit board and holding said gate driver circuit board adjacent to said ceramic card assembly with said switch units located between said gate driver circuit board and said ceramic card assembly.

11. A power module package as claimed in claim 10, said heat sink including an edge wall structure extending beyond said flat, planar surface of said heat sink, said edge wall structure including said circuit board support.

12. A power module package as claimed in claim 7, said metallic pattern including a plurality of pad connection regions, a plurality of contact pads soldered to said pad connection regions, said switch units including terminal legs soldered to a first group of said contact pads, and a bridge connector soldered between a second group of said contact pads.

13. A power module package as claimed in claim 1, said heat sink including an aluminum body, the only electrical connection to said body being said soldering of said metallic layer to said flat, planar heat sink surface.

14. A power module package for a high power, high frequency electrical lamp dimmer system, said power module package comprising:

an elongated metal heat sink having fins on a first side and a flat, planar surface on an opposed second side;

a pair of longitudinal walls flanking said flat planar surface and extending away from said flat planar surface at said second side of said heat sink;

a ceramic card assembly having a flat planar electrically insulating and thermally conductive ceramic layer with opposed first and second faces, a metallic layer bonded onto said first face of said ceramic layer, and a metallic pattern bonded onto said second face of said ceramic layer;

said metallic layer of said ceramic card assembly being soldered to said flat, planar heat sink surface between said longitudinal walls of said heat sink;

said metallic patterns of said ceramic card assemblies including a pair of switch unit base areas;

a plurality of lead frames each including a pad portion having opposed first and second surfaces;

a plurality of high power solid state switch units, each having a flat, planar base contact;

said base contacts of said switch units being soldered to said first surfaces of said pad portions of said lead frames;

said second surfaces of said pad portions of said lead frames being soldered to said switch unit base areas of said metallic pattern;

a gate driver circuit board supported by said longitudinal walls of said heat sink at said second side of said heat sink overlying and spaced away from said switch units and defining a thermal blocking air gap between said gate driver circuit board and said switch units; and electrical connections extending between said gate driver circuit board and said metallic pattern.

15. A power module package as claimed in claim 14, said lead frames including spade terminals extending away from said ceramic card assembly, said gate driver circuit board including openings, and said spade terminals extending through said openings.

16. A power module package as claimed in claim 15, said electrical connections including pin terminals soldered to said metallic pattern.

* * * * *